(12) United States Patent
Jonsson et al.

(10) Patent No.: US 6,356,573 B1
(45) Date of Patent: Mar. 12, 2002

(54) VERTICAL CAVITY SURFACE EMITTING LASER

(75) Inventors: Jan Jonsson; Vilhelm Oscarsson, both of Jarfalla (SE)

(73) Assignee: Mitel Semiconductor AB, Jarfalla (SE)

( * ) Notice: Subject to any disclaimer, the term of this patent is extended or adjusted under 35 U.S.C. 154(b) by 0 days.

(21) Appl. No.: 09/235,302

(22) Filed: Jan. 22, 1999

(30) Foreign Application Priority Data

Jan. 31, 1998 (GB) ............................................. 9802049

(51) Int. Cl.[7] ................................................. H01S 5/06
(52) U.S. Cl. ............................. 372/46; 372/19; 372/96; 372/29.021
(58) Field of Search ............................. 372/45, 46, 19, 372/29.021, 26, 27, 31, 96

(56) References Cited

U.S. PATENT DOCUMENTS

| | | | |
|---|---|---|---|
| 4,277,759 A | * 7/1981 | Tanaka | 331/94.5 |
| 4,337,443 A | * 6/1982 | Umeda | 372/49 |
| 4,864,370 A | 9/1989 | Gaw et al. | 357/17 |
| 5,115,442 A | 5/1992 | Lee et al. | 372/45 |
| 5,262,360 A | 11/1993 | Holonyak, Jr. et al. | 437/237 |
| 5,343,487 A | 8/1994 | Scott et al. | 372/46 |
| 5,345,462 A | 9/1994 | Choquette | 372/45 |
| 5,432,812 A | 7/1995 | Kurobe et al. | 372/99 |
| 5,459,746 A | * 10/1995 | Itaya | 372/46 |
| 5,533,042 A | * 7/1996 | Fukunaga | 372/50 |
| 5,698,865 A | * 12/1997 | Gerner | 257/94 |

FOREIGN PATENT DOCUMENTS

| | | | |
|---|---|---|---|
| DE | 0650202 A1 | * 10/1994 | H01L/33/00 |
| EP | 97102514.3 | 11/1992 | H10L/33/00 |
| EP | 94307801.4 | 10/1994 | H01L/33/00 |
| EP | 0650202 | 4/1995 | H01L/33/00 |
| EP | 0778625 | 6/1997 | H01L/33/00 |

OTHER PUBLICATIONS

Patent Abstract of Japan; vol. 010, No. 240 (E–429), Aug. 19, 1986, JP 61 070773 A (Matsushita Electric Ind. Co. Ltd.), Apr. 11, 1986.

IEEE Journal of Quantum Electronics, vol. 27, No. 6, Jun. 1991 pp 1332–1346.

"Vertical–Cavity Surface–Emitting Lasers", Jewell et al. Munch, Waldemar von; Einfuhrung in die Halbleitertechnologie, Stuttgart, Teubner, 1993, Section. 6.1, (with translation)(No month).

\* cited by examiner

*Primary Examiner*—James W. Davie
*Assistant Examiner*—Gioacchino Inzirillo
(74) *Attorney, Agent, or Firm*—Birch, Stewart, Kolasch & Birch, LLP

(57) ABSTRACT

A top surface emitting vertical cavity laser with enhanced power handling capacity. The laser provides a patterned top electrode for uniformly injecting applied current to the active area. The diameter of the electrode relative to the vertical distance between it and the active layer is reduced by patterning. The result is an improved laser with significant power output.

11 Claims, 4 Drawing Sheets

VERTICAL CAVITY SURFACE EMITTING LASER

FIELD OF THE INVENTION

The present invention relates to a vertical cavity surface emitting laser and more particularly, the present invention relates to a top emitting laser with top electrode current injection having an improved optical mode profile and power handling.

BACKGROUND OF THE INVENTION

Generally speaking, the known laser designs used so far have injected the current by means of a ring contact. However, the diameter of the device is normally larger than the vertical distance from the electrode to the active, light-emitting area. This limits the current spreading and since lasing occurs preferentially around the circumference of the device, several limitations are realized including:

i) design complications in high power lasers by increasing the area, since the maximum output power is proportional to the circumference and not to the area;

ii) coupling difficulties with the output of the light into the optical fibre since the fibre is emitted from a ring pattern along the circumference;

III) low efficiency since lasing takes place close to the current blocking region which surrounds the active volume. This area, whether oxidized, implanted, or designed in other ways, has a higher degree of defects; this leads to low quantum efficiency;

iv) high resistance of the device;

v) a mode pattern which is uncontrolled and varies with the forward current and between individual devices;

vi) high variation of output power between different devices; and vii) a process which requires high precision when defining the electrode pattern.

In the art, current designs position the ring contact outside the emitting area and include a current blocking layer to force the current into the active volume. The current blocking layer may be ion implantation as taught in, for example, U.S. Pat. No. 5,115,442, issued May 19, 1992 to Lee et al. or by oxidation as set forth in U.S. Pat. No. 5,262,360, issued Nov. 16, 1993, to Holonyak, Jr. et al. More frequently employed is a ring electrode partly covering the active, light-emitting area. These designs may be combined with a layer(s) of graded resistivity with varying high and low resistivity to improve the current spreading. Current spreading is described in U.S. Pat. No. 5,343,487, issued Aug. 30, 1994, to Scott et al.

In view of the limitations of existing methodology, there exists a need for greater efficiency in top emitting laser power output. The present invention covers this need and provides a solution as well as a way to control the optical mode profile.

SUMMARY OF THE INVENTION

One object of the present invention is to provide an improved VCSEL with enhanced current spreading.

In accordance with a further object of the present invention, there is provided a light-emitting device, comprising:

a substrate;
a first layer of dielectric mirrors;
an active layer;
a passivated region;
a second layer of dielectric mirrors;
a bonding pad; and
an electrode connected to the pad and in electrical contact with the second layer of dielectric mirrors.

The top electrode of a top emitting VCSEL may take any shape which facilitates current injection in the active region. In the example, a circular electrode with fingers which overlie the conducting, active area is provided, however, it will be appreciated by those skilled that variations achieving the same result, may be used. In terms of variations, the electrode may comprise an arrangement with any number or shape of the fingers toward the center of the device to improve current spreading. The electrode may take a pattern which improves the mode pattern in the device. Further, the electrode may be unsymmetrically, for example, striped to improve the polarization of the device.

Other variations in the design of the device include positioning an inner ring coaxially with the electrode connected to the bond pad. It has also been found that the inventive concept set forth herein may be applied to non-circular forms for the emitting area.

The design of the top contact can be made to enhance polarization to get a higher degree of polarization on the emitted light. The design can be used for any electro optical device, i.e. micro cavity light-emitting diodes (MCLED's or RECLED's). Regarding fabrication, the contacts are normally defined by photolithography, on the top surface; designs using other production methods like electron beam lithography as well as the other suitable techniques may be employed.

A further object of the present invention is to provide a method of enhancing the output power of a light-emitting semiconductor, comprising:

providing a top emitting semiconductor laser having Bragg mirrors, an active region, a passivated region, substrate and bond pad connected to an electrode whereby applied current is concentrated in the active region for increased output power of the semiconductor.

Having thus generally described the invention, reference will now be made to the accompanying drawings illustrating preferred embodiments.

BRIEF DESCRIPTION OF THE DRAWINGS

Similar numerals employed in the text denote similar elements.

DETAILED DESCRIPTION OF THE PREFERRED EMBODIMENTS

Figure 1:
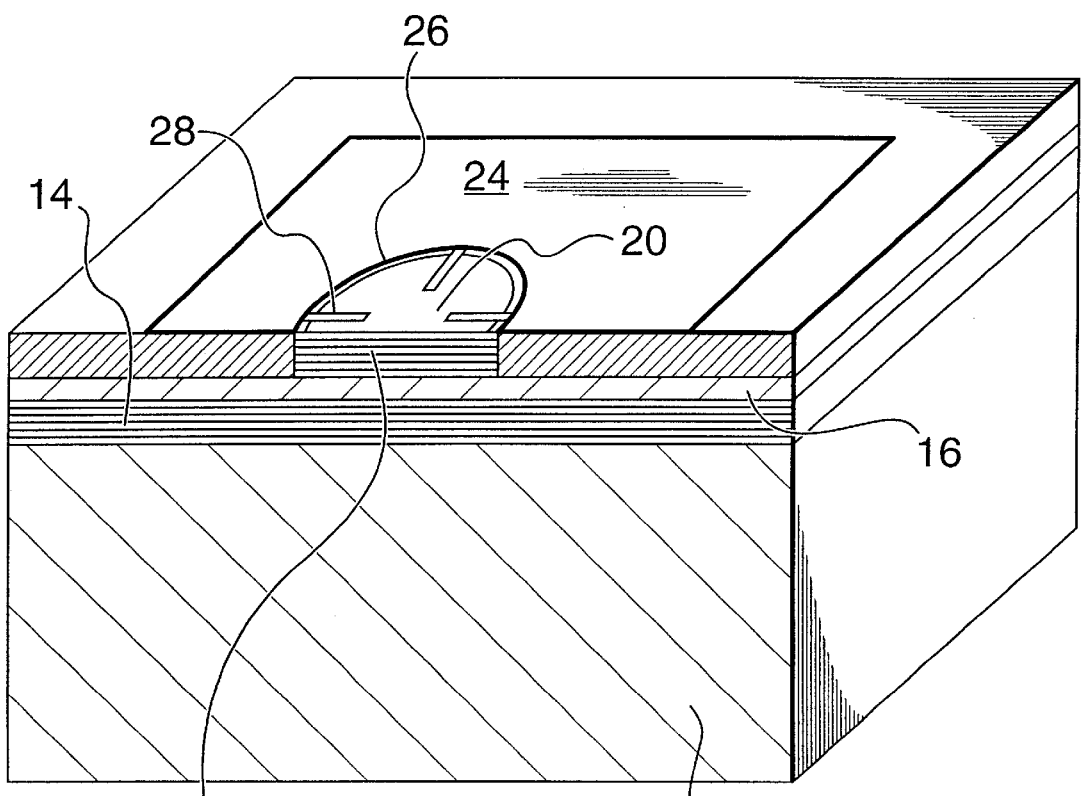
FIG. 1 is a schematic illustration of a VCSEL chip according to one embodiment of the present invention.

Referring now to the drawings, FIG. 1 illustrates a perspective view of a vertical cavity surface emitting laser (VCSEL), generally denoted by numeral 10. The substrate of the device is denoted by numeral 12. The arrangement provides a series of Bragg mirrors 14 adjacent quantum well stack 16. A further series of Bragg mirrors 18 overlie wells 16. An active region 20 is surrounded by a passivated area 22. Generally, these elements are known in the art.

A metal bond pad 24 is positioned on the top of the device 10. Mounted to the pad 24 is a patterned electrode 26, shown in the example to include a semicircular member with projections or fingers 28. The fingers are in equidistant spaced relation and are directed inwardly toward the active area 20. The patterned electrode 26 has been found to be particularly effective for spreading current in comparison to VCSEL arrangements known in the art.

Figure 2:
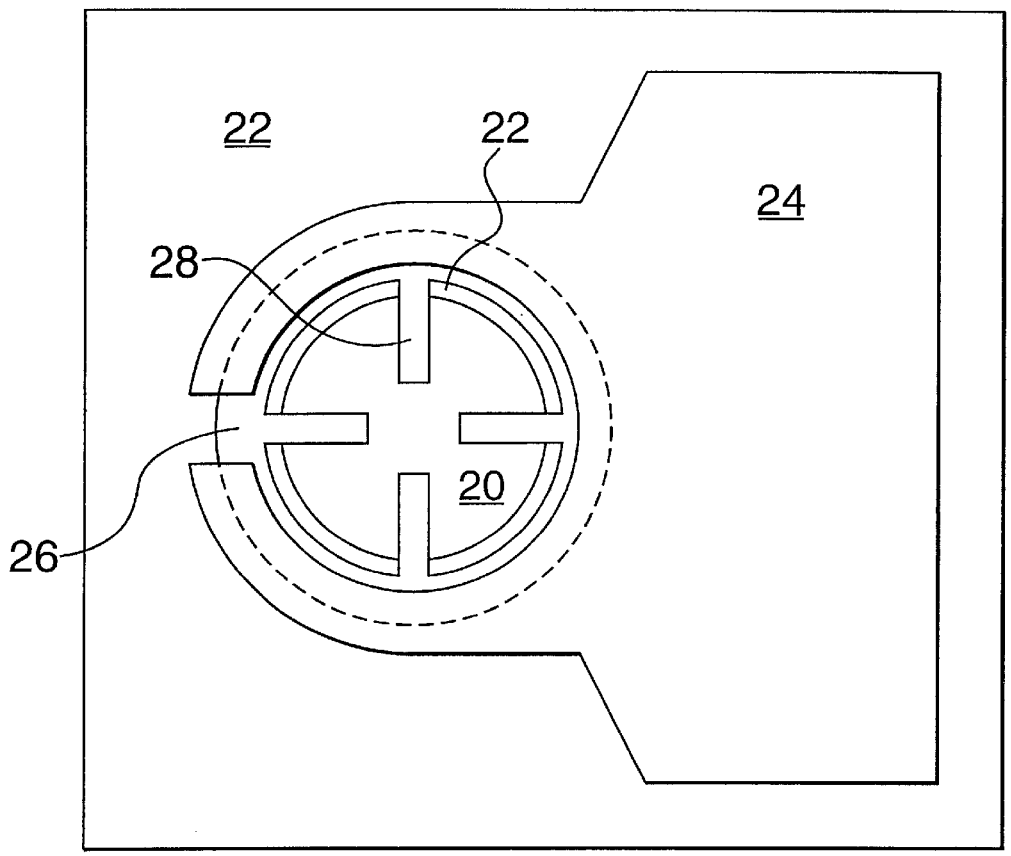
FIG. 2 is a top plan view of FIG. 1.

FIG. 2 illustrates a top view of the VCSEL chip 10. A passivated area 22 surrounds the circular active area 20. The active area is electrically connected to the bond pad 24 by means of the electrode 26 and the fingers 28.

Figure 3:
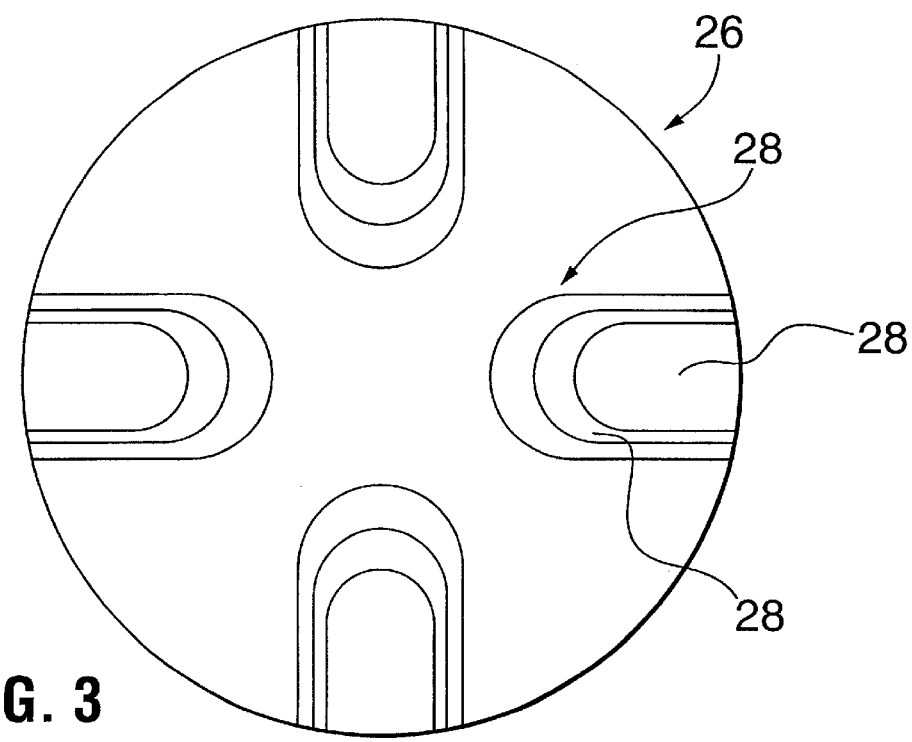
FIGS. 3 through 5 are top plan views of further embodiments of the invention.
Figure 4:
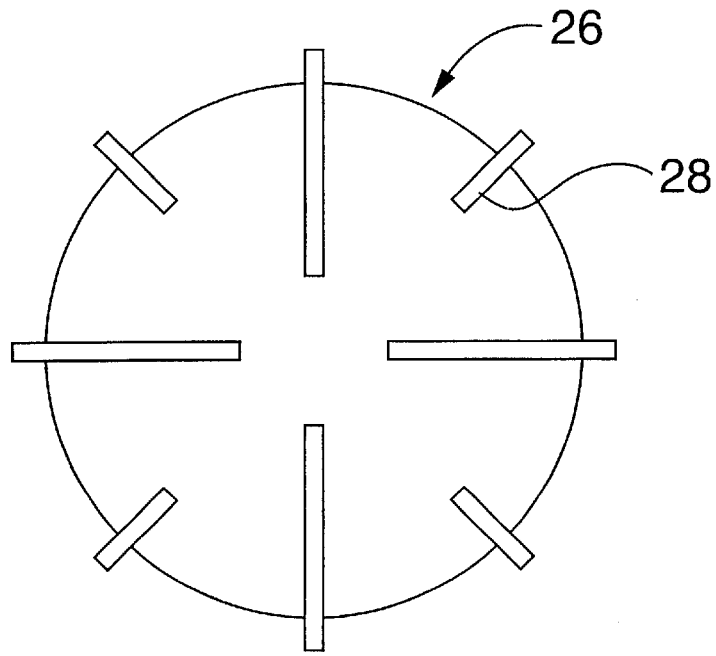
Figure 5:
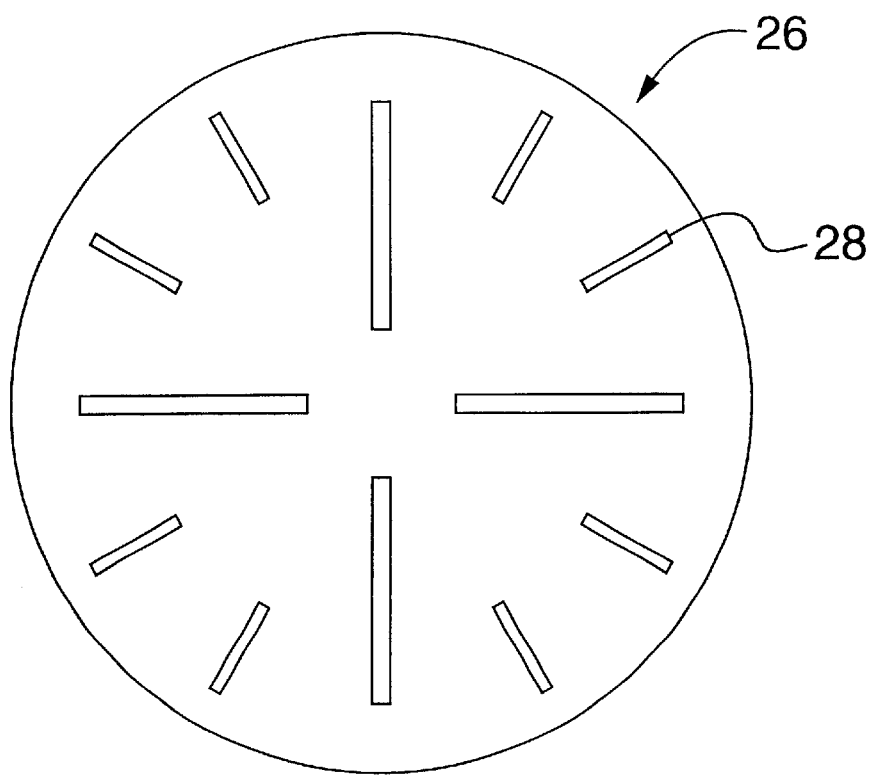

FIGS. 3 through 5 illustrate further variations in the formation of the electrode.

In the embodiment shown in FIG. 3, a quadruplet of electrodes 28 are shown in equidistant and orthogonal relation. Further, each electrode 28 provides a plurality of individual electrodes of different sizes in imbricated disposition and coaxially disposed relative to the active area 28.

With respect to FIG. 4, the projecting electrodes 28 surround the electrode in an angular relationship.

FIG. 5 illustrates a further variation.

Figure 6:
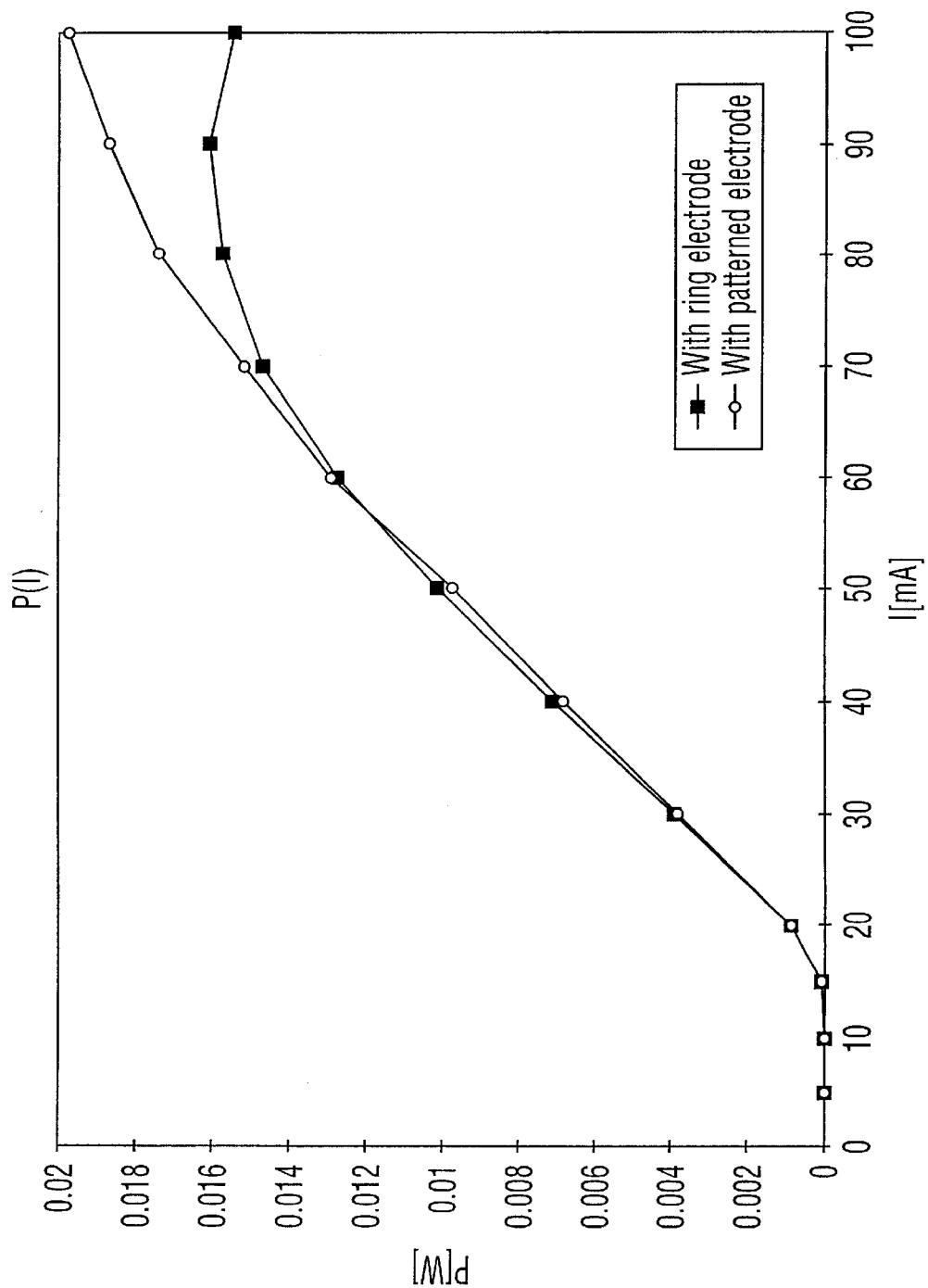
FIG. 6 is a graphical comparison of the output power for a ring electrode and patterned electrode.

In each instance, significant power enhancement was realized when the patterned electrode was employed in comparison to the ring or annular arrangements known in the art. The results generated are illustrated in FIG. 6. It is clear that the patterning has a definite effect on the power handling.

In operation of the devices, current is injected in a desired way by means of the design of the top electrode. By selecting a design for uniform injection it is possible to make a laser which preferably lases in the central part of the active area. Significant advantages flow from this arrangement, which include:

i) an increase in the maximum power with up to 20% for a device with a circular active area with a diameter of 56 um;

ii) an increased fibre coupling efficiency since lasing can be made to occur from the central part of the active area;

iii) the lasing takes preferably part in the central part of the device far away from the current blocking layers with a high density of defects;

iv) low resistance of the device because of an effective current spreading;

v) the mode pattern can be controlled, by means of the electrode pattern, either into a stable mode profile or to the central area of the device, or both;

vi) low variation in output power between devices;

vii) the design can be produced in photolithography without high precision aligning of the electrode mask with the mask that (either directly, or indirectly) causes the current blocking. Aligning two circular masks with almost the same radii (r1 and r2) is critical since the alignment error should be compared to the difference in radius for the circles (r2–r1), any error comparable to r2–r1 (normally around 2–3 microns in top emitting VCSELs) will case a very severe malfunction. Smaller errors also affects also the device properties. For an alignment of the masks of this invention (for example a cross instead of the smaller circle), the alignment error is to be compared with the radius of the circle, r2, which, for the devices on the market today, gives an alignment tolerance which is several times larger.

Although embodiments of the invention have been described above, it is not limited thereto and it will be apparent to those skilled in the art that numerous modifications form part of the present invention insofar as they do not depart from the spirit, nature and scope of the claimed and described invention.

We claim:

1. A laser comprising:

a substrate;

a first layer of mirrors;

an active layer;

a passivated region;

a second layer of mirrors;

a bonding pad; and a patterned electrode connected to said pad and in electrical contact with said second layer of mirrors for improving power handling, optical mode control, and polarization, said electrode comprising a non-annular electrode for concentrating applied current uniformly to said active layer and including projections parallel with said active layer, said projections including further projections.

2. The device as set forth in claim 1, wherein said projections are disposed in equidistant spaced relation.

3. The device as set forth in claim 1, wherein said device comprises a micro cavity emitting laser.

4. The device as set forth in claim 1, wherein said electrode is formed by photolithography.

5. The device as set forth in claim 1, wherein said electrode is formed by electron beam lithography.

6. The device as set forth in claim 1, wherein at least one of said mirrors is dielectric.

7. The device as set forth in claim 2, wherein said device comprises a micro cavity emitting laser.

8. The device as set forth in claim 2, wherein said projections concentrate applied current to a selected portion of said active layer.

9. A method of enhancing the output power of a laser, comprising:

providing a top emitting semiconductor laser having Bragg mirrors, an active region, a passivated region, substrate and bond pad;

forming a patterned non-annular electrode adjacent said active region whereby applied current is concentrated in said active region for increased output power of said semiconductor; and providing said electrode with at least one projection for directing applied current to said active layer, said at least one projection arranged in a parallel relationship with said active layer.

10. The method as set forth in claim 9, including the step of providing a plurality of electrodes coaxially aligned with said active layer.

11. The method as set forth in claim 9, wherein said electrode is patterned for enhancing at least one of optical mode pattern and polarization.

* * * * *

UNITED STATES PATENT AND TRADEMARK OFFICE
CERTIFICATE OF CORRECTION

PATENT NO. : 6,356,573 B1
DATED : March 12, 2002
INVENTOR(S) : Jan Jonsson et al.

It is certified that error appears in the above-identified patent and that said Letters Patent is hereby corrected as shown below:

<u>Title page,</u>
Item [75], change "Oscarsson" to -- Oskarsson --

Signed and Sealed this

Fourth Day of March, 2003

JAMES E. ROGAN
*Director of the United States Patent and Trademark Office*